United States Patent
Lee et al.

(10) Patent No.: US 6,901,024 B2
(45) Date of Patent: May 31, 2005

(54) MULTI-PORT SEMICONDUCTOR MEMORY DEVICE HAVING REDUCED BITLINE VOLTAGE OFFSET AND METHOD FOR ARRANGING MEMORY CELLS THEREOF

(75) Inventors: Chan-ho Lee, Suwon (KR); Young-keun Lee, Anyang (KR)

(73) Assignee: Samsung Electronics Co., Ltd. (KR)

( * ) Notice: Subject to any disclaimer, the term of this patent is extended or adjusted under 35 U.S.C. 154(b) by 141 days.

(21) Appl. No.: 10/303,517

(22) Filed: Nov. 25, 2002

(65) Prior Publication Data

US 2003/0123316 A1 Jul. 3, 2003

(30) Foreign Application Priority Data

Nov. 26, 2001 (KR) ................................ 10-2001-0073736

(51) Int. Cl.⁷ ............................. G11C 8/16; G11C 5/02; G11C 5/06
(52) U.S. Cl. ...................... 365/230.05; 365/51; 365/72; 365/63
(58) Field of Search .............................. 365/230.05, 63, 365/67, 68, 69, 70, 72, 51

(56) References Cited

U.S. PATENT DOCUMENTS

| | | | |
|---|---|---|---|
| 5,287,322 A | | 2/1994 | Rastegar ................ 365/230.05 |
| 5,586,072 A | * | 12/1996 | Longway et al. .............. 365/63 |
| 5,886,919 A | * | 3/1999 | Morikawa et al. ............ 365/69 |
| 6,233,197 B1 | | 5/2001 | Agrawal et al. ........ 365/230.05 |
| 6,259,621 B1 | * | 7/2001 | Li et al. ........................ 365/69 |
| 6,370,078 B1 | * | 4/2002 | Wik et al. .............. 365/230.05 |
| 6,445,638 B1 | * | 9/2002 | Hsu et al. .............. 365/230.05 |

* cited by examiner

*Primary Examiner*—Michael S. Lebentritt
*Assistant Examiner*—J. H. Hur
(74) *Attorney, Agent, or Firm*—Mills & Onello, LLP

(57) ABSTRACT

A multi-port semiconductor memory device includes a plurality of memory cells, each having a first bitline pair and a second bitline pair, and a plurality of flipped memory cells, each having a first flipped bitline pair and a second flipped bitline pair. The memory cells and the flipped memory cells are alternately arranged in a row direction, and a predetermined preparatory memory cell is arranged between the memory cell and the flipped memory cell that are adjacent to each other at a predetermined position in the row direction. In particular, the preparatory memory cell connects the first bitline pair of the memory cell to the second bitline pair of the flipped memory cell and connects the second bitline pair of the memory cell to the first bitline pair of the flipped memory cell.

5 Claims, 7 Drawing Sheets

MULTI-PORT SEMICONDUCTOR MEMORY DEVICE HAVING REDUCED BITLINE VOLTAGE OFFSET AND METHOD FOR ARRANGING MEMORY CELLS THEREOF

BACKGROUND OF THE INVENTION

This application claims the priority of Korean Patent Application No. 2001-73736, filed Nov. 26, 2002, in the Korean Intellectual Property Office, the contents of which are incorporated herein in their entirety by reference.

1. Field of the Invention

The present invention relates to a multi-port semiconductor memory device, and more particularly, to a multi-port semiconductor memory device having a reduced bitline voltage offset and method for arranging memory cells thereof.

2. Description of the Related Art

In general, memory cores of semiconductor memory devices are laid out in an array in which each memory cell is connected to a bitline pair and a wordline, and circuits for accessing memory cells are laid out around memory cores. As demands on high speed systems increase, semiconductor memory devices with increasing high speed and low power consumption are needed. Thus, in order to realize high speed and low power consumption in semiconductor devices, a design method, that is, a lay-out method, as well as a semiconductor manufacturing method are also very important.

FIG. 1 shows a circuit diagram of a bit memory cell structure of a multi-port SRAM. FIG. 2 shows a lay-out of a bit memory cell of FIG. 1, and FIG. 3 shows only bitlines in the lay-out of the bit memory cell of FIG. 2.

Referring to FIG. 1, a bit memory cell of a multi-port SRAM includes inverters I1 and I2 constituting a latch, access transistors T1 and T2 that are controlled by a first wordline wl-1 and are connected to a first bitline pair (BIT1, BITB1), and access transistors T3 and T4 that are controlled by a second wordline wl-2 and are connected to a second bitline pair (BIT2, BITB2).

Here, the first bitline pair (BIT1, BITB1) corresponds to a first port, and the second bitline pair (BIT2, BITB2) corresponds to a second port. Also, Ci1 through Ci5 represent interline capacitance occurring between bitlines, and Cg1 through Cg4 represent wire capacitance of bitlines.

Referring to FIGS. 2 and 3, a twisted bitline structure is used such that defects caused by the mismatch of interline capacitance occurring between bitlines of each port in a memory cell of a multi-port SRAM are reduced. On the other hand, a large amount of mismatch of bitline capacitance occurring between ports occurs. Specifically, the capacitance of the first bitline pair (BIT1, BITB1) has a comparatively low value. In contrast, since the second bitline pair (BIT2, BITB2) is twisted and thus has a relatively large length, the capacitance of the second bitline pair (BIT2, BITB2) is larger than the capacitance of the first bitline pair (BIT1, BITB1). Also, a via contact is used in the second bitline pair (BIT2, BITB2) so that the second bitline pair (BIT2, BITB2) can be twisted. In addition, because the length of the second bitline pair (BIT2, BITB2) is great, the resistance of the second bitline pair (BIT2, BITB2) is increased.

Thus, mismatch occurs between the capacitance and the resistance of the first bitline pair (BIT1, BITB1) and between the capacitance and the resistance of the second bitline pair (BIT2, BITB2). As a result, a voltage offset occurs as a bitline voltage builds-up.

FIG. 4 shows a timing diagram illustrating a case where a bitline voltage builds-up at each port in a memory cell of FIG. 1. Referring to FIGS. 1 and 4, the first bitline pair (BIT1, BITB1) and the second bitline pair (BIT2, BITB2) are pre-charged at a power supply voltage VDD level, and the first and second wordlines wl-1 and wl-2 are simultaneously at a logic "high" level at t0. As a result, a bitline voltage builds-up. In this case, if a target different voltage margin of a sense amplifier (not shown) for sensing a voltage of bitlines is set to $\Delta v$, the bitline BIT1 at a first port reaches VDD-$\Delta$ v at t1, and the bitline BIT2 at a second port reaches VDD-$\Delta$ v at t2, which is larger than t1. As such, a voltage offset of $\Delta$ v1 occurs. This is why the bitline BIT2 at the second port has a capacitance and resistance larger than the capacitance and resistance of the bitline BIT1 at the first port, as described above.

However, if sense amplifiers for sensing voltages of the first bitline pair (BIT1, BITB1) of the first port and the second bitline pair (BIT2, BITB2) of the second port have the same enabling time, a sense amplifier should be enabled between t0 and t2 at the second port even though the sense amplifier is enabled only between t0 and t1 at the first port. Thus, the sense amplifier is inevitably enabled between t0 and t2 at the first port in the same manner as at the second port. As a result, an access time of the first port increases, and to this end, the operating speed is reduced, and more power corresponding to $\Delta$ v1 is consumed at the first port.

FIG. 5 shows a lay-out of a memory cell array of a conventional multi-port SRAM including memory cells of FIG. 2. Referring to FIG. 5, the conventional multi-port SRAM includes a plurality of memory cells 511, 512, 513, and 514, as shown in FIG. 2, and a plurality of flipped memory cells 521, 522, 523, and 524.

The flipped memory cells 521, 522, 523, and 524 are similar to the memory cells 511, 512, 513, and 514 but are rotated in a mode (RX, RY). The memory cells 511, 512, 513, and 514 and the flipped memory cells 521, 522, 523, and 524 are alternately arranged in line in a row direction. Also, the shape in which the memory cells 511, 512, 513, and 514 and the flipped memory cells 521, 522, 523, and 524 are arranged in line in the row direction is iteratively arranged in a column direction.

FIG. 6 shows a lay-out illustrating that one memory cell is connected to one flipped memory cell in FIG. 5, and FIG. 7 shows only bitlines in the lay-out of the memory cells of FIG. 6.

Referring to FIGS. 6 and 7, a first bitline pair (BIT1, BITB1) of a lower memory cell 512 is connected to a first bitline pair (BITB1, BIT1) of an upper flipped memory cell 522, and a second bitline pair (BIT2, BITB2) of the lower memory cell 512 is connected to a second bitline pair (BITB2, BIT2) of the upper flipped memory cell 522.

As a result, lengths of the first bitline pairs (BIT, BITB1) are equalized, and thus the capacitance and resistance of the first bitline pairs (BIT1, BITB1) are equalized. Also, lengths of the second bitline pairs (BIT2, BITB2) are equalized, and thus the capacitance and resistance of the second bitline pairs (BIT2, BITB2) are equalized. That is, the capacitance and resistance between bitline pairs at each port are equalized. However, the lengths of the first bitline pairs (BIT1, BITB1) at the first port and the lengths of the second bitline pairs (BIT2, BITB2) at the second port are different, and thus capacitance and resistance between two ports are different.

As a result, in the memory cell array of the conventional multi-port SRAM shown in FIG. 5, a great difference between the capacitance and resistance of the first port and the capacitance and resistance of the second port occurs. As such, as described above, in the conventional multi-port SRAMs, a voltage offset occurs during a bitline voltage build-up, and as a result, the operating speed is reduced, and power consumption increases.

SUMMARY OF THE INVENTION

To solve the above and other problems, it is a first object of the present invention to provide a multi-port semiconductor memory device having a reduced bitline voltage offset.

It is a second object of the present invention to provide a method for arranging memory cells so as to reduce a bitline voltage offset in a multi-port semiconductor memory device.

Accordingly, there is provided in accordance with the invention a multi-port semiconductor memory device. The multi-port semiconductor memory device includes a plurality of memory cells, each having a first bitline pair and a second bitline pair, and a plurality of flipped memory cells, each having a first flipped bitline pair and a second flipped bitline pair. The memory cells and the flipped memory cells are alternately arranged in a row direction, and a predetermined preparatory memory cell is arranged between the memory cell and the flipped memory cell that are adjacent to each other at a predetermined position in the row direction.

In one embodiment, the memory cells and the flipped memory cells are 8-transistor memory cells. The preparatory memory cell can connect the first bitline pair of the memory cell to the second bitline pair of the flipped memory cell and can connect the second bitline pair of the memory cell to the first bitline pair of the flipped memory cell.

In accordance with the invention, there is also provided a method for arranging memory cells of a multi-port semiconductor memory device which comprises a plurality of memory cells, each having a first bitline pair and a second bitline pair, and a plurality of flipped memory cells, each having a first flipped bitline pair and a second flipped bitline pair. The method comprises alternately arranging the memory cells and the flipped memory cells in a row direction, and arranging a predetermined preparatory memory cell between the memory cell and the flipped memory cell that are adjacent to each other at a predetermined position in the row direction. The preparatory memory cell connects the first bitline pair of the memory cell to the second bitline pair of the flipped memory cell and connects the second bitline pair of the memory cell to the first bitline pair of the flipped memory cell.

In one embodiment, the memory cells and the flipped memory cells are 8-transistor memory cells.

Accordingly, in the multi-port semiconductor memory device according to the present invention, lengths of all bitlines are made equal by the preparatory memory cell, and as a result the capacitance and resistance of all bitlines are equalized. As a result, in the multi-port semiconductor memory device according to the present invention, unlike the prior art, a bitline voltage offset is removed or largely reduced, the operating speed is improved, and power consumption is reduced.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
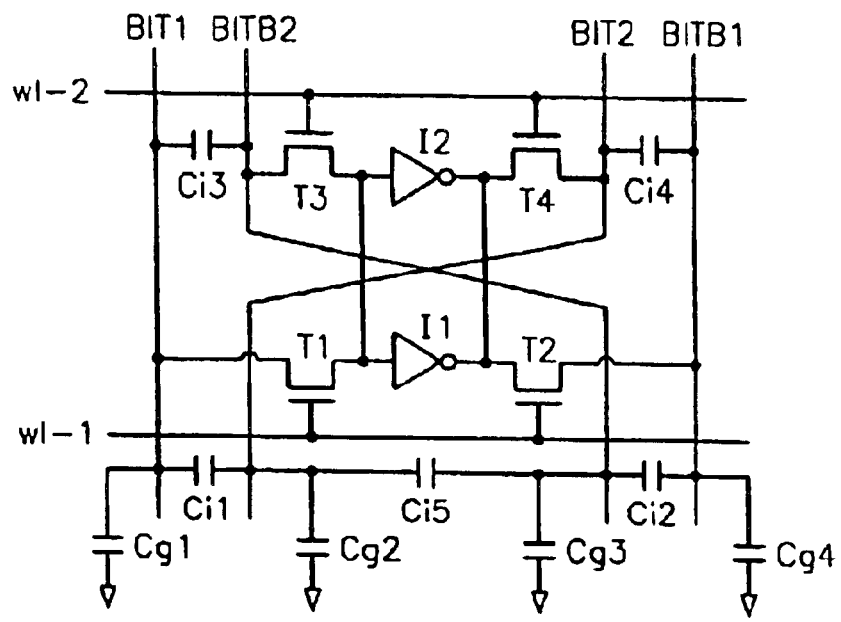
FIG. 1 contains a circuit diagram of a bit memory cell structure of a multi-port SRAM.

The present invention will be described more fully hereinafter with reference to the accompanying drawings in which preferred embodiments of the invention are shown. Like reference numerals refer to like elements throughout the drawings.

Figure 8:
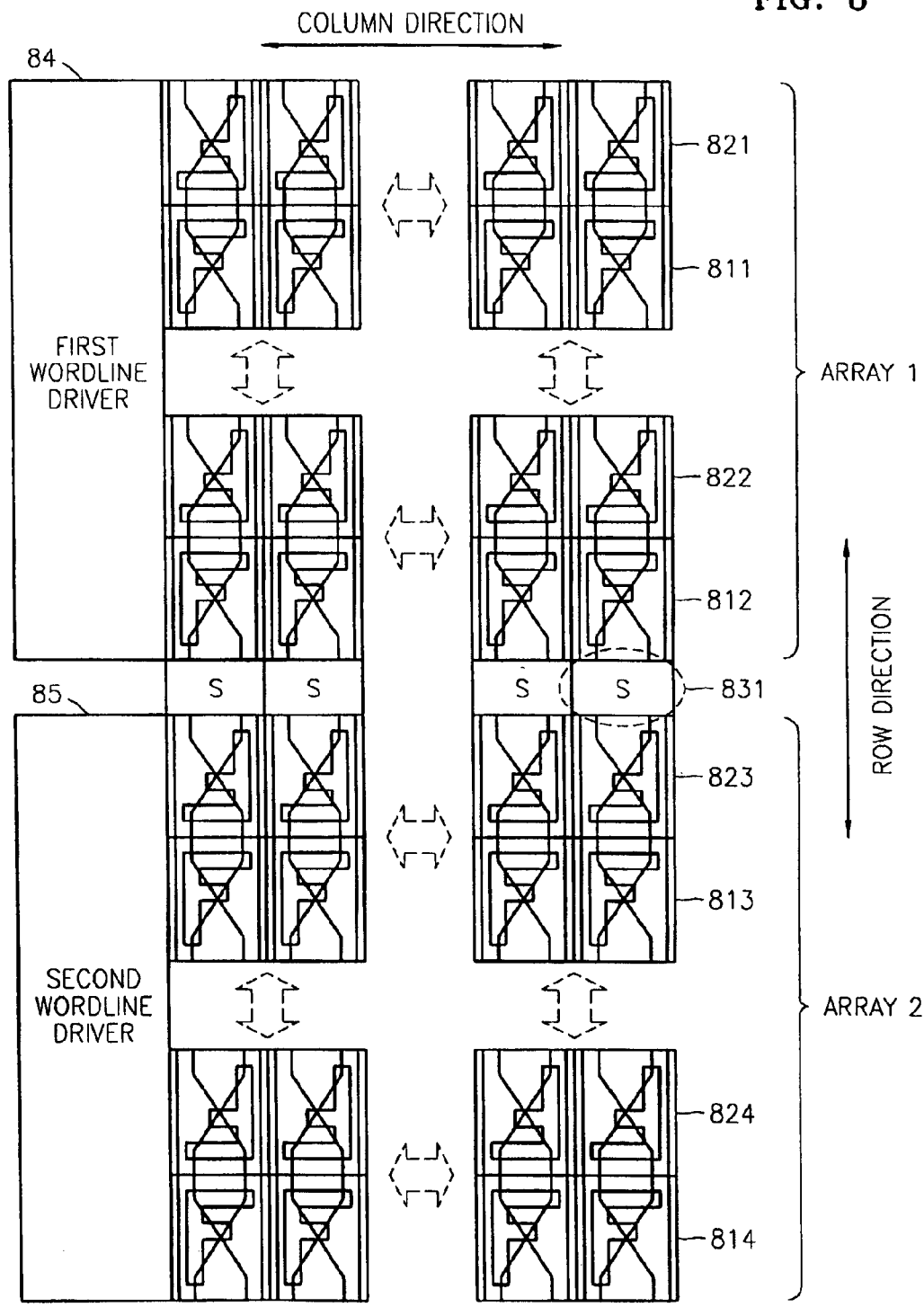
FIG. 8 contains a lay-out diagram of a memory cell array of a multi-port semiconductor memory device according to the present invention.

FIG. 8 shows a lay-out of a memory cell array of a multi-port semiconductor memory device according to the present invention. Referring to FIG. 8, a multi-port semiconductor memory device according to the present invention includes a plurality of memory cells 811, 812, 813, and 814 and a plurality of flipped memory cells 821, 822, 823, and 824.

Figure 2:
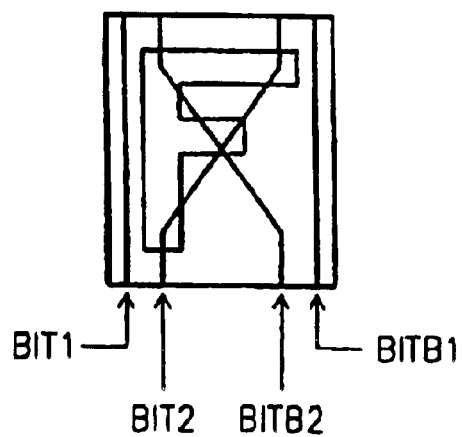
FIG. 2 contains a lay-out diagram of a bit memory cell of FIG. 1
Figure 3:
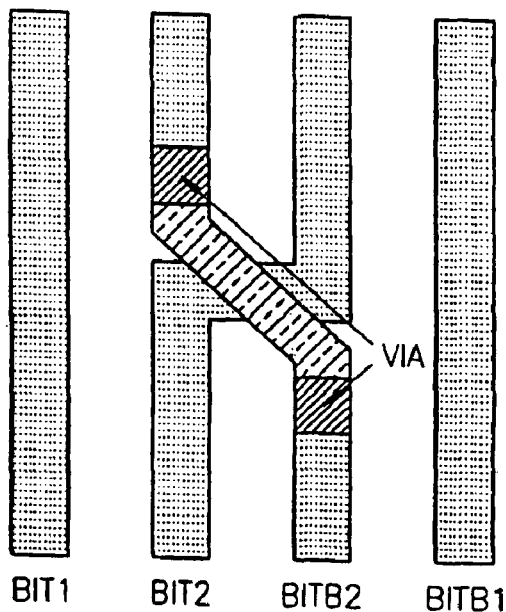
FIG. 3 contains a detailed lay-out diagram of only bitlines in the lay-out of the bit memory cell of FIG. 2.
Figure 4:
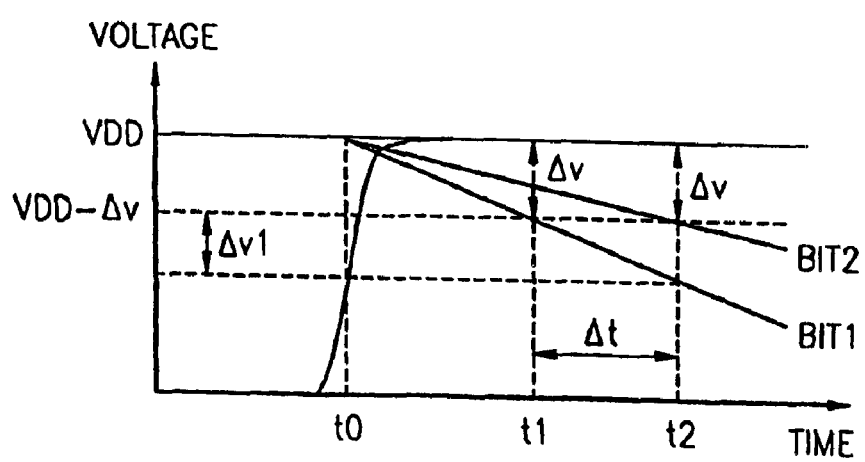
FIG. 4 contains a timing diagram illustrating a case where a bitline voltage builds-up at each port in a memory cell of FIG. 1.
Figure 5:
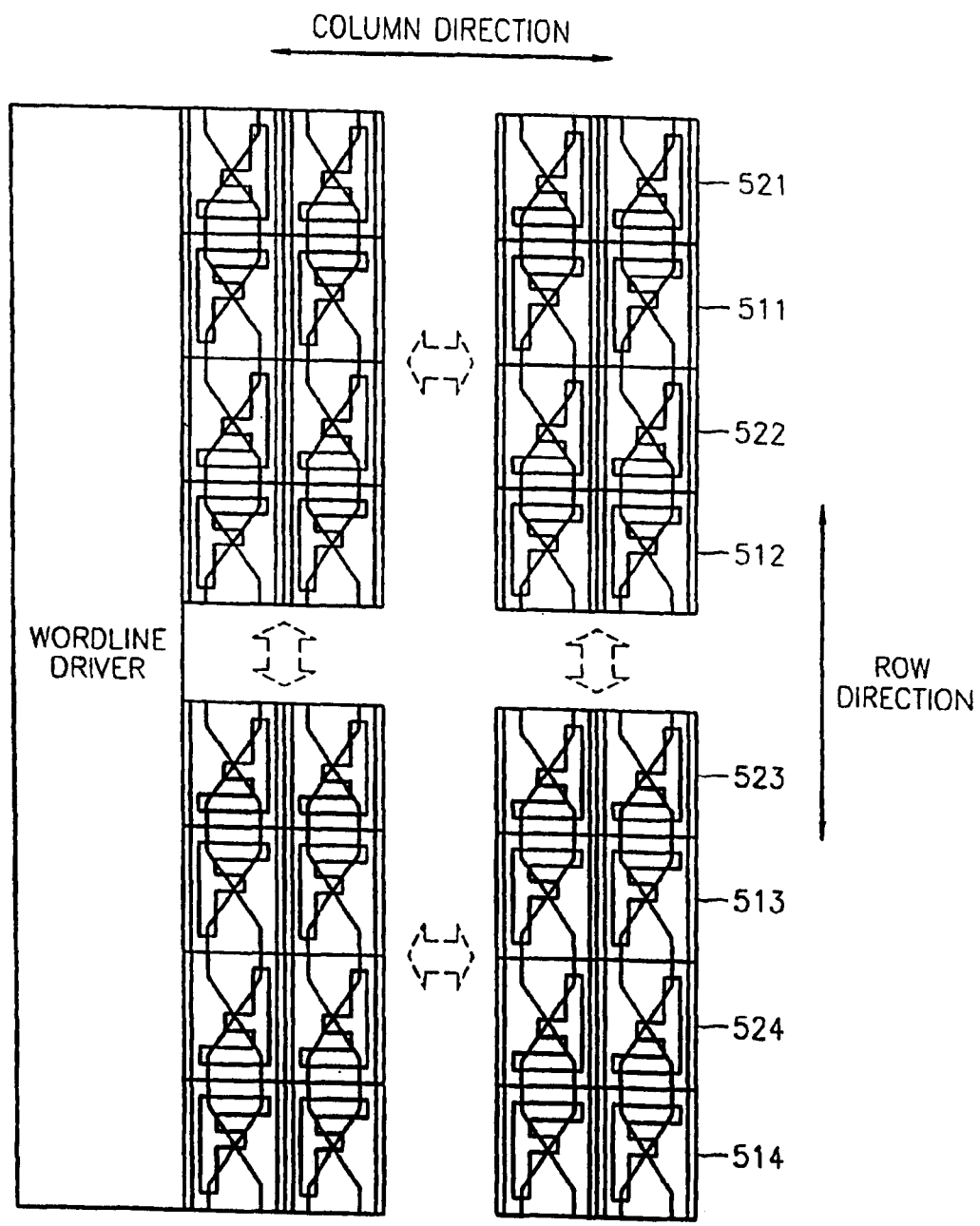
FIG. 5 contains a lay-out diagram of a memory cell array of a conventional multi-port SRAM including memory cells of FIG. 2.
Figure 6:
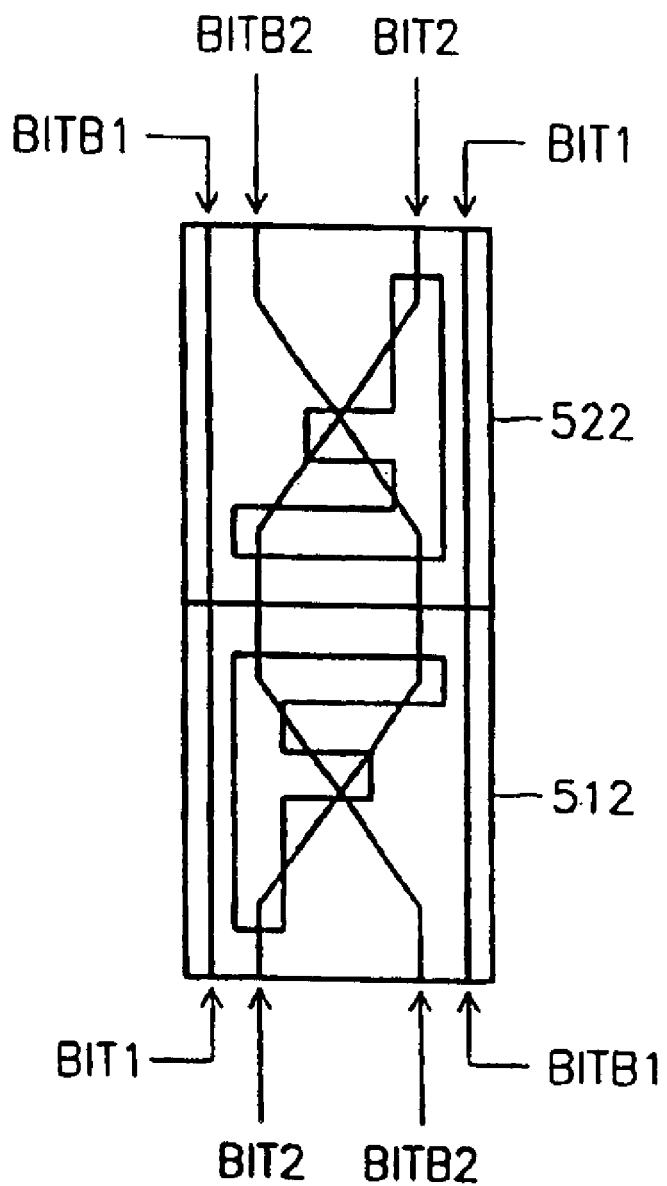
FIG. 6 contains a lay-out diagram illustrating that one memory cell is connected to one flipped memory cell in FIG. 5.
Figure 7:
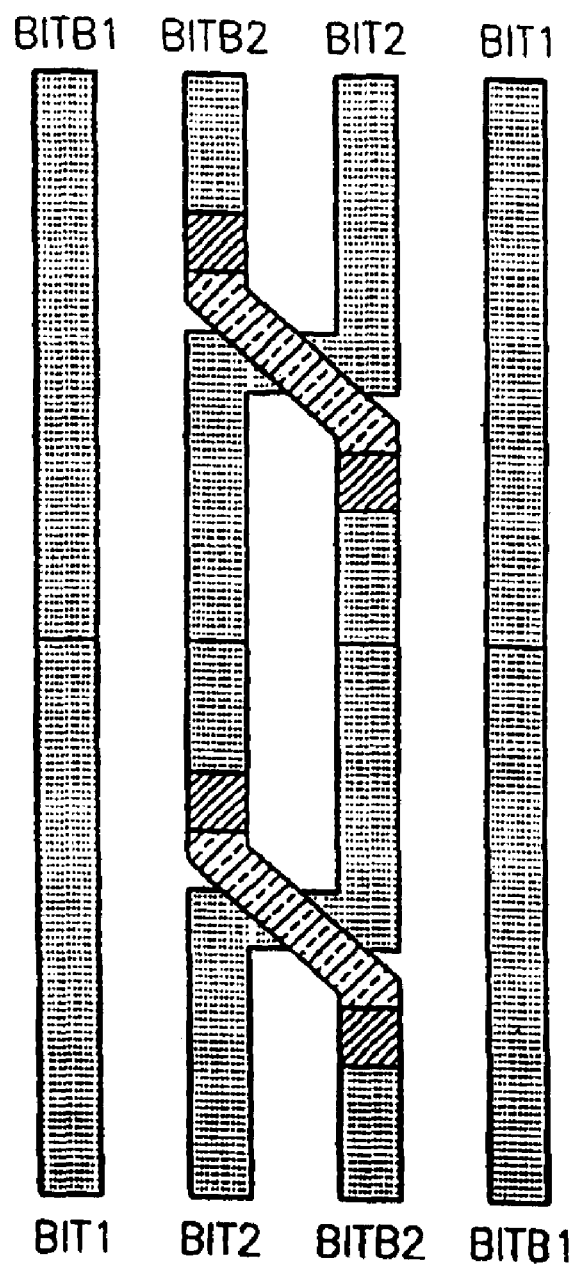
FIG. 7 contains a detailed lay-out diagram of only bitlines in the lay-out of the memory cells of FIG. 6.

The memory cells 811, 812, 813, and 814 are 8-transistor memory cells that are the same as the memory cells shown in FIGS. 1 and 2 and have a first bitline pair (BIT1, BITB1) and a second bitline pair (BIT2, BITB2). More specifically, the memory cells 811, 812, 813, and 814 include inverters I1 and I2 constituting a latch, access transistors T1 and T2 that are controlled by a first wordline wl-1 and are connected to the first bitline pair (BIT1, BITB1), and access transistors T3 and T4 that are controlled by a second wordline wl-2 and are connected to the second bitline pair (BIT2, BITB2). Here, the first bitline pair (BIT1, BITB1) corresponds to a first port, and the second bitline pair (BIT2, BITB2) corresponds to a second port.

The flipped memory cells 821, 822, 823, and 824 are similar to the memory cells 811, 812, 813, and 814 but are rotated in a mode (RX, RY) and have a second bitline pair flipped with a first flipped bitline pair. The memory cells 811, 812, 813, and 814 and the flipped memory cells 821, 822, 823, and 824 are alternately arranged in line in a row direction. Also, the shape in which the memory cells 811, 812, 813, and 814 and the flipped memory cells 821, 822, 823, and 824 are arranged in line in the row direction is iteratively arranged in a column direction.

In particular, in the multi-port semiconductor memory device according to the present invention, a predetermined preparatory memory cell 831 is arranged between the memory cell 812 and the flipped memory cell 823 that are adjacent to each other in a predetermined position in the row direction. Preferably, when the number of memory cells arranged in a row direciton is n (a natural number), the preparatroy memory cell 831 is arranged between a (n/2)-th memory cell and a ((n/2)+1)-th flipped memory cell, that is, in the center of an upper array Array1 and a lower array Array2.

The structure of the preparatory memory cell 831 will be described with reference to FIG. 9.

Figure 9:
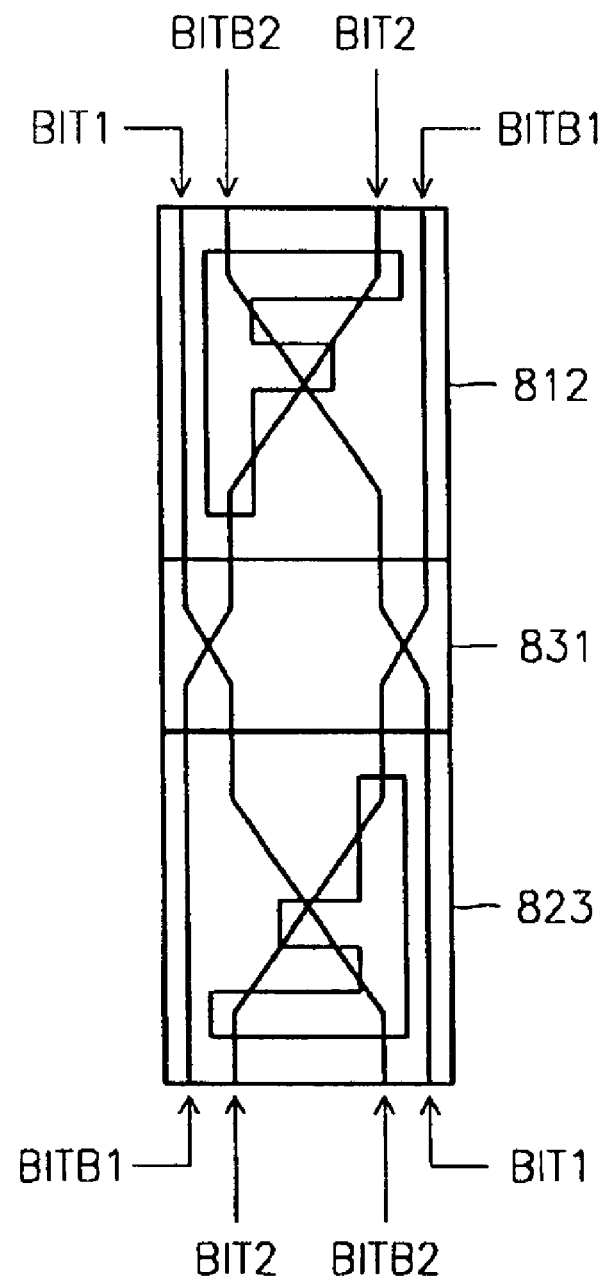
FIG. 9 illustrates the structure of a preparatory memory cell of FIG. 8 and an upper memory cell being connected to a lower flipped memory cell.

FIG. 9 shows the structure of the preparatory memory cell 831 of FIG. 8 and an upper memory cell 812 being connected to a lower flipped memory cell 823. Referring to FIG. 9, the preparatory memory cell 831 connects the first bitline pair (BIT1, BITB1) of the upper memory cell 812 to the second bitline pair (BITB2, BIT2) of the lower flipped memroy cell 823 and connects the second bitline pair (BIT2, BITB2) of the upper memory cell 812 to the first bitline pair (BITB1, BIT1) of the lower flipped memory cell 823.

As a result, lengths of all bitlines are equalized, and thus the capacitance and resistance of all bitlines are equalized. Thus, in the multi-port semiconductor memory device according to the present invention, unlike the prior art, a bitline voltage offset is removed or largely reduced, the operating speed is improved, and power consumption is reduced.

Meanwhile, the first bitline pair (BIT1, BITB1) of the first port of the upper memory cell 812 is connected to the second bitline pair (BITB2, BIT2) of the second port of the lower flipped memroy cell 823 by the preparatory memory cell 831, and the second bitline pair (BIT2, BITB2) of the second port of the upper memory cell 812 is connected to the first bitline pair (BITB1, BIT1) of the first port of the lower flipped memory cell 823 by the preparatory memory cell 831, and thus the structure of a wordline driver is varied, unlike the prior art. That is, as shown in FIG. 8, a wordline driver is separated into first and second wordline drivers 84 and 85, and output ports of the first wordline drvier 84 are connected inversely to the second wordline driver 85. That is, a first output port at the first wordline driver 84 becomes a second output port at the second wordline driver 85, and a second output port of the first wordline driver 84 becomes a first output port at the second wordline driver 85.

Hereinafter, in the multi-port semiconductor memory device according to the present invention, the equalization of capacitance and resistance of all bitlines will be described with reference to the following Equations.

First, the total capacitance of bitlines at the upper array Array1 or lower array Array2 shown in FIG. 8 is obtained by Equation 1.

$Cta\_bit1 = (Cg1+Cg4+Ci1+Ci2+Ci3+Ci4) \times n/4$ $Cta\_bitb1 = (Cg1+Cg4+Ci1+Ci2+Ci3+Ci4) \times n/4$ $Cta\_bit2 = (Cg2+Cg3+Ci1+Ci2+Ci3+Ci4+Ci5 \times 2) \times n/4$ $Cta\_bitb2 = (Cg2+Cg3+Ci1+Ci2+Ci3+Ci4+Ci5 \times 2) \times n/4$ (1)

Here, $Cta\_bit1$ represents the total capacitance of a bitline BIT1 in the upper array Array1 or lower array Array2, and $Cta\_bitb1$ represents the total capacitance of a complementary bitline BITB1 in the upper array Array1 or lower array Array2. $Cta\_bit2$ represents the total capacitance of a bitline BIT2 in the upper array Array1 or lower array Array2, and $Cta\_bitb2$ represents the total capacitance of a complementary bitline BITB2 in the upper array Array1 or lower array Array2.

In addition, as shown in FIG. 1, Ci1 represents the interline capacitance between the bitlines BIT1 and BIT2 in one memory cell, Ci2 represents interline capacitance between the complementary bitlines BITB1 and BITB2 in one memory cell, Ci3 represents interline capacitance between the bitlines BIT1 and BITB2 in one memory cell, and Ci4 represents interline capacitance between the complementary bitlines BITB1 and BIT2 in one memory cell. Also, Cg1 represents the capacitance of the bitline BIT1 in one memory cell, Cg2 represents the capacitance of the bitline BITB2 in one memory cell, Cg3 represents the capacitance of the complementary bitline BITB2 in one memory cell, and Cg4 represents the capacitance of the complementary bitline BITB1 in one memory cell.

Disregarding the capacitance in the preparatory memory cell 831, the total capacitance of bitlines in the entire array, in which the capacitance of the upper array Array1 and the capacitance of the lower array Array2 are summed togther, is obtained by Equation 2.

$Ct\_bit1 = (Cta\_bit1+Cta\_bit2)$ $Ct\_bitb1 = (Cta\_bit1+Cta\_bit2)$ $Ct\_bit2 = (Cta\_bitb1+Cta\_bitb2)$ $Ct\_bitb2 = (Cta\_bitb1+Cta\_bitb2)$ (2)

Here, $Ct\_bit1$ represents the total capacitance of the bitlines BIT1 in the entire array, and $Ct\_bitb1$ represents the total capacitance of the complementary BITB1 in the entire array. $Ct\_bit2$ represents the total capacitance of the bitlines BIT2 in the entire array, and $Ct\_bitb2$ represents the total capacitance of the complementary bitline BITB2 in the entire array.

Next, Equation 3 is obtained by substituting Equation 1 into Equation 2.

$Ct\_bit1 = (Cg1+Cg2+Cg3+Cg4+Ci1 \times 2+Ci2 \times 2+Ci3 \times 2+Ci4 \times 2+Ci5 \times 2) \times n/4$ $Ct\_bitb1 = (Cg1+Cg2+Cg3+Cg4+Ci1 \times 2+Ci2 \times 2+Ci32+Ci4 \times 2+Ci5 \times 2) \times n/4$ $Ct\_bit2 = (Cg1+Cg2+Cg3+Cg4+Ci1 \times 2+Ci2 \times 2+Ci3 \times 2+Ci4 \times 2+Ci5 \times 2) \times n/4$ $Ct\_bitb2 = (Cg1+Cg2+Cg3+Cg4+Ci1 \times 2+Ci2 \times 2+Ci3 \times 2+Ci4 \times 2+Ci5 \times 2) \times n/4$ (3)

As known from Equation 3, in the multi-port semiconductor memory device according to the present invention, the capacitance of all bitlines are equalized.

Meanwhile, the total resistance of bitlines in the upper array Array1 or lower array Array2 shown in FIG. 8 is obtained by Equation 4.

$Rta\_bit1 = (Rw0+Rw1) \times n/4$ $Rta\_bitb1 = (Rw0+Rw1) \times n/4$ $Rta\_bit2 = (Rw2+Rw3) \times n/4$ $Rta\_bitb2 = (Rw2+Rw3) \times n/4$ (4)

Here, $Rta\_bit1$ represents the total resistance of the bitline BIT1 in the upper array Array1 or lower array Array2, and Rta_bitb1 represents the total resistance of the complementary bitline BITB1 in the upper array Array1 or lower array Array2.

Rta_bit2 represents the total resistance of the bitline BIT2 in the upper array Array1 or lower array Array2, and Rta_bitb2 represents the total resistance of the complementary bitline BITB2 in the upper array Array 1 or lower array Array2.

In addition, Rw0 represents the vertical wire resistance of the bitline BIT1 in one memory cell, Rw1 represents the vertical wire resistance of the complementary bitline BITB1 in one memory cell, Rw2 represents the vertical wire resistance of the bitline BIT2 in one memory cell, and Rw3 represents the vertical wire resistance of the complementary bitline BITB2 in one memory cell.

Disregarding the resistance of the preparatory memory cell 831, the total resistance of bitlines in the entire array, in which the resistance of the upper array Array1 and the resistance of the lower array Array2 are summed together, is obtained by Equation 5.

$$Rt\_bit1 = (Rta\_bit1 + Rta\_bit2)$$

$$Rt\_bitb1 = (Rta\_bit1 + Rta\_bit2)$$

$$Rt\_bit2 = (Rta\_bitb1 + Rta\_bitb2)$$

$$Rt\_bitb2 = (Rta\_bitb1 + Rta\_bitb2) \quad (5)$$

Next, Equation 6 is obtained by substituting Equation 4 into Equation 5.

$$Rt\_bit1 = (Rw0 + Rw1 + Rw2 + Rw3) \times n/4$$

$$Rt\_bitb1 = (Rw0 + Rw1 + Rw2 + Rw3) \times n/4$$

$$Rt\_bit2 = (Rw0 + Rw1 + Rw2 + Rw3) \times n/4$$

$$Rt\_bitb2 = (Rw0 + Rw1 + Rw2 + Rw3) \times n/4 \quad (6)$$

As known from Equation 6, in the multi-port semiconductor memory device according to the present invention, the resistance of all bitlines are equalized.

As described above, in the multi-port semiconductor memory device according to the present invention, the lengths of all bitlines are equalized, and thus the capacitance and resistance of all bitlines are equalized. Thus, in the multi-port semiconductor memory device according to the present invention, unlike the prior art, a bitline voltage offset is removed or largely reduced, the operating speed is improved, and power consumption is reduced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A multi-port semiconductor memory device comprising:
    a plurality of memory cells, each having a first bitline pair and a second bitline pair; and
    a plurality of flipped memory cells, each having a first flipped bitline pair and a second flipped bitline pair;
    wherein the memory cells and the flipped memory cells are alternately arranged in a row direction, and a predetermined preparatory memory cell is arranged between the memory cell and the flipped memory cell that are adjacent to each other at a predetermined position in the row direction,
    wherein total lengths of the first bitline pairs, the second bitline pairs, the first flipped bitline pairs and the second flipped bitline pairs in the row direction are substantially equal.

2. The device of claim 1, wherein the memory cells and the flipped memory cells are 8-transistor memory cells.

3. The device of claim 1, wherein the preparatory memory cell connects the first bitline pair of the memory cell to the second bitline pair of the flipped memory cell and connects the second bitline pair of the memory cell to the first bitline pair of the flipped memory cell.

4. A method for arranging memory cells of a multi-port semiconductor memory device which comprises a plurality of memory cells, each having a first bitline pair and a second bitline pair, and a plurality of flipped memory cells, each having a first flipped bitline pair and a second flipped bitline pair, the method comprising:
    alternately arranging the memory cells and the flipped memory cells in a row direction; and
    arranging a predetermined preparatory memory cell between the memory cell and the flipped memory cell that are adjacent to each other in a predetermined position in the row direction,
    wherein the preparatory memory cell connects the first bitline pair of the memory cell to the second bitline pair of the flipped memory cell and connects the second bitline pair of the memory cell to the first bitline pair of the flipped memory cell;
    wherein total lengths of the first bitline pairs, the second bitline pairs, the first flipped bitline pairs and the second flipped bitline pairs in the row direction are substantially equal.

5. The method of claim 4, wherein the memory cells and the flipped memory cells are 8-transistor memory cells.

* * * * *